(12) United States Patent
Lacarnoy

(10) Patent No.: US 10,651,650 B2
(45) Date of Patent: May 12, 2020

(54) FOUR SEGMENT AC MOSFET SWITCH

(71) Applicant: SCHNEIDER ELECTRIC IT CORPORATION, West Kingston, RI (US)

(72) Inventor: Alain Lacarnoy, Saint Nazaire les Eymes (FR)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 408 days.

(21) Appl. No.: 15/025,665

(22) PCT Filed: Sep. 30, 2013

(86) PCT No.: PCT/US2013/062600
§ 371 (c)(1),
(2) Date: Mar. 30, 2016

(87) PCT Pub. No.: WO2015/047387
PCT Pub. Date: Apr. 2, 2015

(65) Prior Publication Data
US 2016/0241030 A1 Aug. 18, 2016

(51) Int. Cl.
H02J 3/00 (2006.01)
H02M 7/487 (2007.01)
H03K 17/74 (2006.01)
H03K 17/567 (2006.01)
H03K 17/0416 (2006.01)
H03K 17/687 (2006.01)
(Continued)

(52) U.S. Cl.
CPC .............. *H02J 3/00* (2013.01); *H02M 7/487* (2013.01); *H03K 17/04163* (2013.01);
(Continued)

(58) Field of Classification Search
CPC . H02J 3/00; H02M 7/00; H02K 17/00; H03K 17/00
(Continued)

(56) References Cited

U.S. PATENT DOCUMENTS 4,491,750 A 1/1985 Janutka
7,239,118 B2 7/2007 Halberstadt et al.
(Continued)

FOREIGN PATENT DOCUMENTS

CN 1666404 A 9/2005

OTHER PUBLICATIONS

Notification of Transmittal of the International Search Report and the Written Opinion of the International Searching Authority from corresponding PCT/US2013/062600 dated Feb. 27, 2014.
(Continued)

*Primary Examiner* — Hal Kaplan
*Assistant Examiner* — Joseph N Inge
(74) *Attorney, Agent, or Firm* — Lando & Anastasi, LLP

(57) ABSTRACT

At least one aspect of the disclosure is directed to an AC switching system. The AC switching system includes a first I/O, a second I/O, a first segment including a first plurality of switches, the first segment being coupled to the first I/O, a second segment including a second plurality of switches, the second segment being coupled with the first segment and coupled to the second I/O, a third segment including a diode, the third segment being coupled to the first I/O and coupled to a junction of the first segment and the second segment, and a fourth segment including a diode, the fourth segment being coupled to the second I/O and coupled to the junction of the first segment and the second segment.

21 Claims, 6 Drawing Sheets

(51) Int. Cl.
*H03K 17/12* (2006.01)
*H03K 17/041* (2006.01)

(52) U.S. Cl.
CPC ....... *H03K 17/567* (2013.01); *H03K 17/6874* (2013.01); *H03K 17/74* (2013.01); *H03K 17/04106* (2013.01); *H03K 17/127* (2013.01); *H03K 2217/0009* (2013.01); *H03K 2217/0036* (2013.01)

(58) Field of Classification Search
USPC .......................................................... 307/113
See application file for complete search history.

(56) References Cited

U.S. PATENT DOCUMENTS

| | | | | |
|---|---|---|---|---|
| 8,488,336 | B2* | 7/2013 | Lacarnoy | H02M 7/483 363/17 |
| 8,513,913 | B2* | 8/2013 | Dubovsky | H01M 10/465 320/101 |
| 2005/0111246 | A1* | 5/2005 | Lai | H02M 5/225 363/157 |
| 2011/0109162 | A1* | 5/2011 | Rizet | H02M 7/487 307/66 |
| 2011/0211378 | A1* | 9/2011 | Maroon | H02M 7/003 363/125 |
| 2012/0092915 | A1 | 4/2012 | Okuda et al. | |
| 2014/0334199 | A1* | 11/2014 | He | H02M 5/458 363/37 |

OTHER PUBLICATIONS

Partial Supplementary European Search Report from corresponding European Application No. 13894466.5 dated Mar. 21, 2017.
Infineon., "MOSFET (Metal Oxide Semiconductor Field Effect Transistor) Data Sheet", Edition Aug. 1, 2011, Published by Infineon Technologies AG.

* cited by examiner

FOUR SEGMENT AC MOSFET SWITCH

CROSS-REFERENCE TO RELATED APPLICATIONS

This application is a U.S. National Stage Application under 35 U.S.C. § 371 of International Application No. PCT/US2013/062600, filed Sep. 30, 2013, titled FOUR SEGMENT AC MOSFET SWITCH, which is hereby incorporated herein by reference in its entirety.

BACKGROUND OF INVENTION

1. Field of Invention

At least some embodiments described herein relate generally to AC switching systems, and more particularly to high-speed switching within segments of AC switching systems and to devices that utilize high-speed switches.

2. Discussion of Related Art

Traditional power conversion approaches such as AC/DC buck bi-directional converters, DC/AC inverters, AC/AC converters (e.g., matrix converters), and Bipolar Switched Neutral Point Clamped (BSNPC) utilize AC switches. A typical AC switch generally includes transistors and diodes.

SUMMARY OF INVENTION

At least one aspect of the disclosure is directed to an AC switching system. The AC switching system includes a first I/O, a second I/O, a first segment including a first plurality of switches, the first segment being coupled to the first I/O, a second segment including a second plurality of switches, the second segment being coupled with the first segment and coupled to the second I/O, a third segment including a diode, the third segment being coupled to the first I/O and coupled to a junction of the first segment and the second segment, and a fourth segment including a diode, the fourth segment being coupled to the second I/O and coupled to the junction of the first segment and the second segment.

In the AC switching system, each of the first plurality of switches and the second plurality of switches may include at least one metal-oxide semiconductor field-effect transistor (MOSFET). In addition, the at least one MOSFET may be configured as a low-voltage MOSFET. 4. The at least one MOSFET may also be configured as a high-voltage MOSFET.

In the AC switching system, each of the second segment and the third segment may further include at least one switching device. 6. Further, the at least one switching device may be an insulated bi-polar transistor (IGBT).

In the AC switching system, each of the first diode and the second diode may a silicon-carbide (SiC) diode.

The AC switching system may further include a first switching device, wherein the first switching device may be configured to couple a positive voltage to the second I/O during a first mode of operation, and a second switching device, wherein the second switching device may be configured to couple a negative voltage to the second I/O during a second mode of operation. Each of the first switching device and the second switching device may be a silicon-carbide junction gate field-effect transistor (SiC-JFET). In addition, each the first switching device and the second switching device may be an IGBT device.

In one embodiment, the AC switching system may be configured to function as an AC/DC buck bi-directional converter. In another embodiment, the AC switching system may be configured to function as a matrix converter.

Another aspect of the disclosure is directed to a method of operating an AC switching system. The AC switching system may include a first I/O and a second I/O. The method may include the acts of closing a first switching device, the first switching device providing a path for a first current through a first diode and a second diode to the second I/O during a first period of time, closing a second switching device during a second period of time, the second period of time being greater than the first period of time, the second switching device coupling the first I/O to a junction of the first diode and the second diode to provide a second current from the first I/O to the second I/O, and closing a third switching device during a third period of time, the third switching device being coupled to the first diode and providing a path for the second current through a third diode, wherein the third diode is coupled to the second I/O, and wherein a majority of the second current during the second period of time and the third period of time is conducted through the second switching device, and only a portion of the first current is conducted by the third diode during the third period of time.

The method may further include closing the third switching device, the third switching device providing a path for a third current through a fourth diode and a fifth diode to the first I/O during a fourth period of time. In addition, the method may further include the acts of closing a fourth switching device during a fifth period of time, the fifth period of time being greater than the fourth period of time, the fourth switching device coupling the second I/O to a junction of the fourth diode and the fifth diode to provide a fourth current from the second I/O to the first I/O, and closing the first switching device during a sixth period of time, the first switching device being coupled to the fourth diode and providing a path for the fourth current through a sixth diode.

In the method, the act of closing the first switching device during a sixth period of time may further include coupling the sixth diode to the first I/O, and wherein a majority of the fourth current during the fifth period of time and the sixth period of time is conducted through the fourth switching device, and only a portion of the fourth current is conducted by the sixth diode during the sixth period of time.

The method may further include the acts of opening a fifth switching device prior to the first period of time, the fifth switching device being coupled to a positive DC voltage, and opening a sixth switching device prior to the fourth period of time, the sixth switching device being coupled to a negative DC voltage.

Yet another aspect of the disclosure is directed to an AC switching system. The AC switching system may include a first I/O, a second I/O, a first segment including a first plurality of switches, the first segment being coupled to the first I/O, a second segment including a first switch and a second switch, the second segment being coupled to the first segment and coupled to the second I/O, a third segment including a diode, the third segment being coupled to the first I/O and coupled to a first junction of the first switch and the second switch, and a fourth segment including a diode, the fourth segment being coupled to the second I/O and coupled to a second junction of two switches of the first plurality of switches.

The AC switching system may further include a first switching device, wherein the first switching device may be configured to couple a positive voltage to the second I/O during a first mode of operation, and a second switching device, wherein the second switching device may be configured to couple a negative voltage to the second I/O during a second mode of operation. In the AC switching system, each of the positive voltage and the negative voltage may be under 200 volts.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
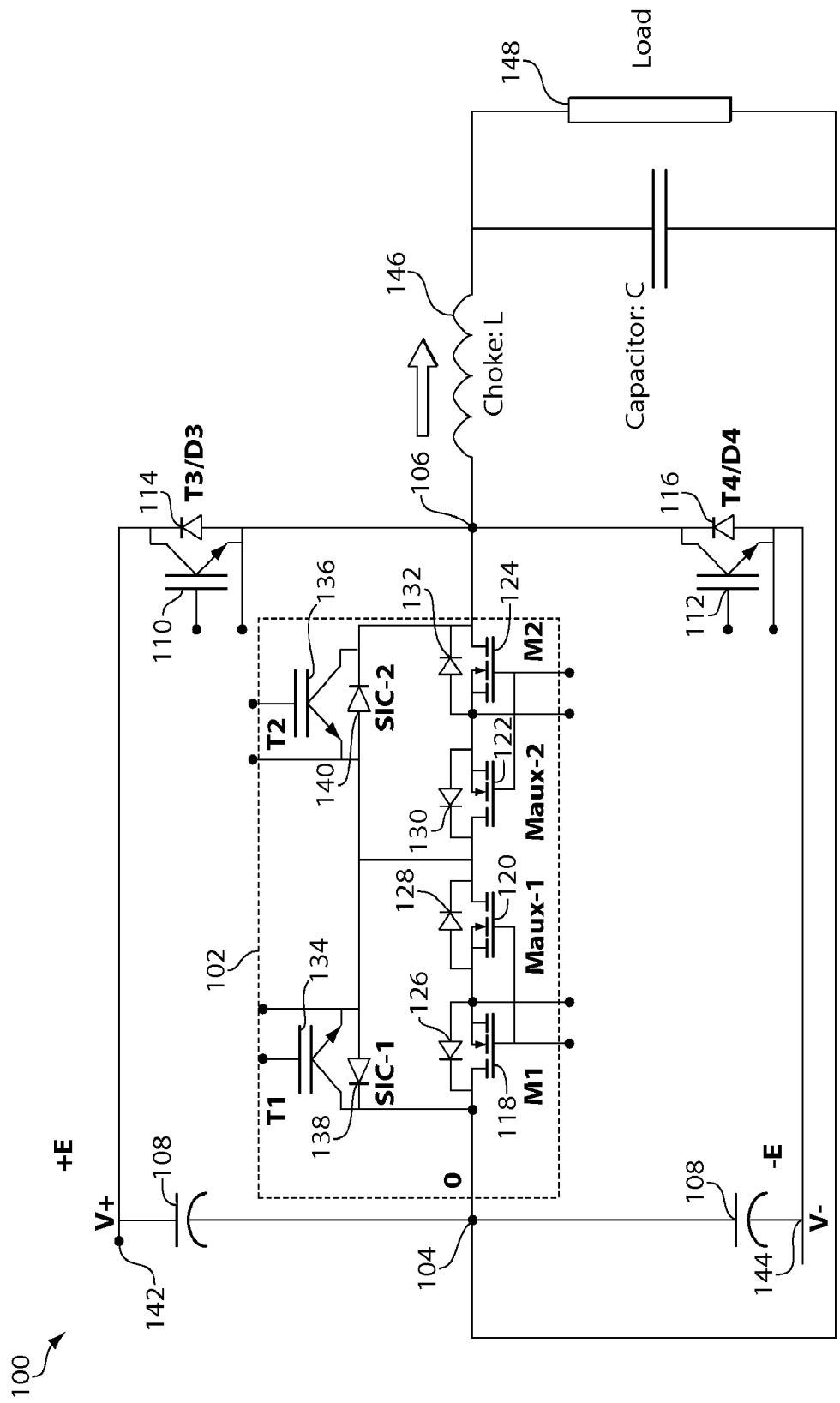
FIG. 1 is a schematic diagram of an inverter with an AC switch according to one embodiment.

Various embodiments and aspects thereof will now be discussed in detail with reference to the accompanying drawings. It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Typical power converter arrangements include switching devices such as transistors in series. Insulated bi-polar transistor (IGBT) switches may be used to provide high current capacity and low conduction loses; however, the switching frequency is typically low and IGBT's typically have high switching losses. Other solutions, such as metal-oxide semiconductor field-effect transistor (MOSFET) based switching circuits provide high switching frequency with low switching loses; however, the current capacity is typically low and the overall component costs are typically higher.

At least some embodiments herein provide an AC switch for AC switching systems which mitigate the negatives of the previous approaches and achieves high switching frequencies (and thus, smaller filter components and higher power density), high current capacity, and minimal losses associated with conduction and commutation of the switching devices. A non-limiting list of applications for AC switches disclosed herein include uninterruptable power supplies (UPSs), inverters, AC/DC buck converters to charge batteries, converters for smart grids, electronic transformers, drivers for motors, and AC/AC converters (e.g., matrix converters).

Some embodiments disclosed herein include an arrangement of different available semi-conductor technologies to overcome the short comings associated with traditional power conversion topologies. Some of the following embodiments provide an AC switch for use within switching systems which advantageously uses the high current capacity of IGBT switching devices in combination with the high switching frequency of MOSFET switching devices. In addition, some embodiments are directed to an AC switch which avoids the passage of the totality of current over silicon carbide (SiC) diodes, which exploits the SiC diodes switching properties while keeping the SiC diode relatively small (and thus, less expensive). As will be discussed below, the benefits of such an arrangement maximizes electrical and thermal efficiency, as well as optimizes harmonic distortion and overall density of power conversion devices.

FIG. 1 is a block diagram of one embodiment of an AC switch included in a single-phase three-level inverter generally designated at 100. The inverter 100 includes the AC switch 102, a neutral point 104, capacitors 108, switching devices 110 and 112, anti-parallel diodes 114 and 116, an output 106, an inductor 146, and a load 148. As used herein, the neutral point 104 and output 106 may be referred to as a first I/O and a second I/O, respectively. I/O may represent a junction of two or more components of a circuit or simply a point of reference or an input or output node of a circuit or device. In the shown embodiment, the AC switch 102 includes MOSFET transistors 118, 120, 122 and 124, body diodes 126-132, IGBT transistors 134 and 136, and silicon carbide (SiC) diodes 138 and 140. In the shown embodiment MOSFET transistors 118 and 124 are configured as high-voltage MOSFETs and MOSFET transistors 120 and 122 are configured as low-voltage MOSFETs.

In the shown embodiment, the neutral point 104 may be configured to be coupled to a junction of V+142 of a first DC power supply (not shown) and V−144 of a second DC power supply (not shown). The neutral point 104 is also coupled to a first end of the AC switch 102. The switching device 110 is configured to selectively couple V+142 to the output 106. A collector of the switching device 110 is coupled to the first end of the input 104 with an emitter of the switching device 110 coupled to the output 106. The anti-parallel diode 114 is coupled between the collector and the emitter of the switching device 110. Likewise, the switching device 112 is configured to selectively couple a second end of the neutral point 104 to the output 106. A collector of the switching device 112 is coupled to output 106 with an emitter coupled to the second end of the input 104. The anti-parallel diode 116 is coupled between the collector of the switching device 112 and the emitter of the switching device 112. In the shown embodiment, the switching devices 110 and 112 are IGBT transistors; however, in other embodiments different types of switches may be utilized. For example, in one embodiment switching devices 110 and 112 are SiC FET type transistors. A first end of the inductor 146 is coupled to the output 106 with a second end of the conductor 146 coupled to a first end of load 148. A second end of the load 148 is coupled to the neutral point 104.

Still referring to FIG. 1, the AC switch 102 is configured with a first end coupled to the neutral point 104 and a second end coupled to the output 106. The AC switch 102 is configured in four segments. The switching devices 118 and 120 and their respective body diodes 126 and 128 may be referred to herein as a first segment. The switching devices 122 and 124 and their respective body diodes 130 and 132 may be referred to herein as a second segment. The switching device 134 and the diode 138 may be referred to herein as a third segment. The switching device 136 and the diode 140 may be referred to herein as a fourth segment.

In the shown embodiment, the first segment is configured with a drain of the switching device 118 coupled to the input 104 with a source of the switching device 118 coupled to a source of the switching device 120. A gate of the switching device 118 is coupled to a gate of the switching device 120 (to simultaneously change the state of both switching device 118 and 120). In the second segment, a drain of the switching device 120 is coupled to a drain of the switching device 122 with a source of the switching device 122 coupled to a source of the switching device 124. A gate of the switching device 122 is coupled to a gate of the switching device 124 (to simultaneously change the state of both switching device 122 and 124). A drain of the switching device 124 is coupled to the output 106. Each switching device 118-124 of the first and second segment is configured with one of the body diodes 126-132 coupled from drain to cathode and source to anode, respectively. Switching devices 134-136 of the second and third segments are configured in parallel with the switching devices 118-124 of the first and second segments. The third segment is configured with a collector of the switching device 134 is coupled to the junction of the neutral point 104, the cathode of diode 126, and the drain of the switching device 118. An emitter of the switching device 134 is coupled to the junction of the drain of the switching device 120 and the drain of switching device 122 as well as to the emitter of the switching device 136. In the fourth segment, a collector of the switching device 136 is coupled to the junction of the output 106, the cathode of the diode 132, and the drain of the switching device 124. Switching devices 134 and 136 of the third and the fourth segments are configured with the diodes 138 and 140 which are coupled from collector to cathode and from emitter to anode, respectively.

In the shown embodiment, diodes 138 and 140 are SiC diodes; however, in other embodiments they may be other types of diodes. Also in the shown embodiment, switching devices 118 and 124 are high-voltage Super Junction MOSFETs, such as COOLMOS™ transistors manufactured by Infineon Technologies of Neubiberg, Germany. A typical Super Junction is capable of handling high voltages (e.g., 650+ volts) with an $R_{DS(ON)}$ ranging from 20-40 mΩ. In addition, in the shown embodiment the switching devices 120 and 122 are low-voltage MOSFETs typically capable of handling low voltages (e.g., less than 60 volts) with an $R_{DS(ON)}$ of 2-4 mΩ). As will be discussed below with reference to FIGS. 2A and 2B, the switching devices 120 and 122 include body diodes 128 and 130 which advantageously provide a low forward voltage during conduction (e.g., 0.8/1 Volt), good thermal resistance, junction-to-case (RthJC).

Figure 2A:
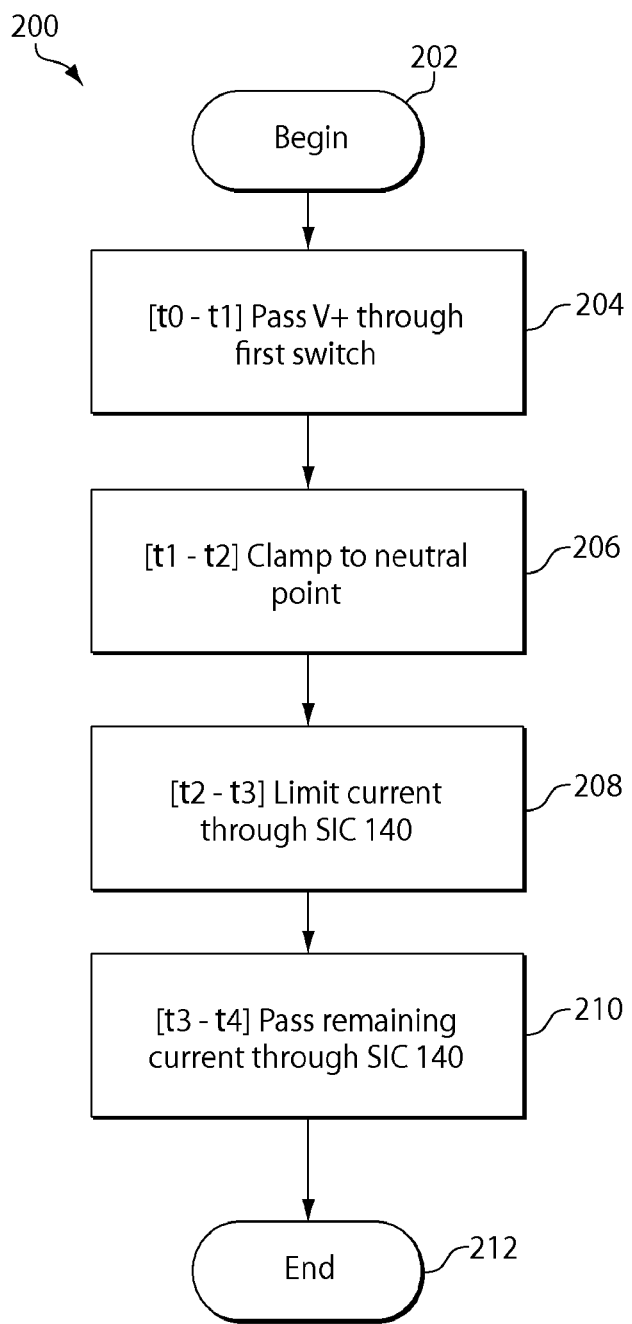
FIG. 2A is a diagram of a method of operating an AC switch according to one embodiment.
Figure 2B:
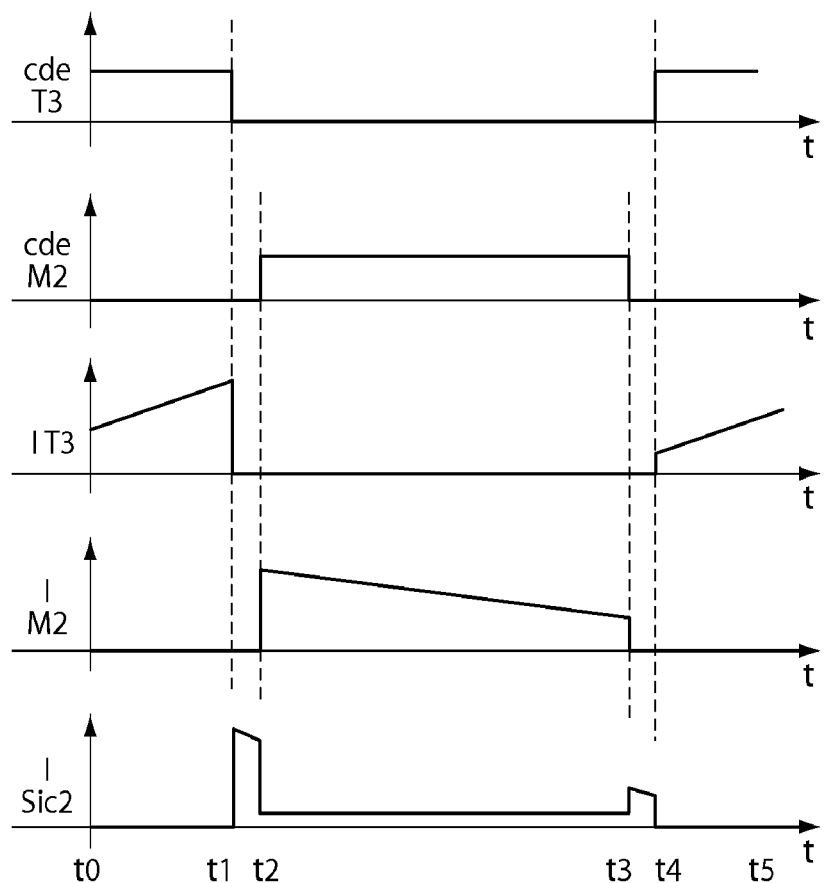
FIG. 2B is a timing diagram of the inverter of FIG. 1 during operation according to one embodiment.

Referring to FIGS. 2A and 2B, a method of operating the inverter 100 in a continuous mode is generally designated at 200. During acts 204, 206, 208 and 210 switching devices 114 and 116, 118-124, 134 and 136 may be driven (i.e., switched on and off) by a pulse width modulation (PWM) signal. It should be understood that gate voltages may be provided by a PWM or may be from any other signal generating source known in the art. The method begins in act 202.

In act 204, the switching device 110 is switched on (i.e., closed) coupling V+ to the output 106. As illustrated in FIG. 2B, during t0-t1 a positive voltage is applied to the gate of switching device 110 (code T3). As the switching device 110 begins to conduct current (I T3) begins to rise.

In act 206, the switching device 110 is switched off (i.e., opened) decoupling V+ from the output 106. At substantially the same time, switching device 134 is switched on (i.e., closed), along with switching devices 118 and 120, clamping the inductor 146 and the load 148 to the neutral point 104. The current through switching device 118 causes the body diode 128 of the switching device 120 to become forward biased and begins to conduct. Switching device 134, configured in parallel with the switching device 118 and the body diode 128 of the switching device 120, then conducts the current over the SiC diode 140 which, as a result, begins to conduct. Referring to FIG. 2B, the current through the diode 140 during t1-t2 is represented as I sic2. As will be discussed below, only a portion of total current passes through the SiC diode 140 over a given period.

As discussed above, MOSFET switching devices have high switching frequency, thus enabling the switching devices 118 and 124 to perform optimally during the commutation of the switching device 110. In addition, MOSFET devices also have a low switching cost (i.e., minimal power loss). In contrast, switching device 134 may be configured as an IGBT switching device which provides a weak Vce(sat) and handles a majority of the current. However, as discussed above, IGBT devices have a slower switching frequency and high switching costs (i.e., power loss). To this end, the combination of MOSFET and IGBT switching devices in parallel provides high switching frequency while maintaining high current capacity. For example, the IGBT switching device 134 has a substantially nonexistent loss because the IGBT switching device 134 is switched when zero volts are across the switch (i.e., zero-voltage switch (ZVS) mode). In act 206, the MOSFET switching devices (e.g., switching devices 118, 124, etc) are turned on before the IGBT switching devices (e.g., switching devices 134 and 136). In this way, the MOSFET switching devices insure high frequency switching while the IGBT switching devices insure high current capacity. In the shown embodiment, the switching device 120 is a low-power MOSFET device. The use of the body diode 128 of the low-power MOSFET limits loss during conduction as the forward voltage is very low (e.g., 8/1 volt). As will be discussed further below, in act 204-210 the AC switch 102 is configured to pass only a portion of the total current through the AC switch 102 over the SiC diode 140 during conduction. For this reason, the diode 140, configured as a SiC diode, may be smaller than would otherwise be required to pass the entirety of the current (and thus, making the AC switch less expensive to produce). Also, SiC diodes have no reverse recovery charge, and therefore, the use of an SiC diode limits losses during switching operations of the AC switch 102.

In act 208, switching devices 122 and 124 are turned on (i.e., closed). As a result, the current is provided a parallel path over the switching device 122 and 124 and the diode 140. In this parallel arrangement, the AC switch 102 conducts a majority of the current in a direction through the switching device 122 and the body diode 132 of the switching device 124. FIG. 2B illustrates a small amount of resulting current across the SiC diode 140 (I sic2) from t2-t3.

In act 210, switching devices 120 and 122 are switched off (e.g., opened) resulting in the remaining current passing through the SiC diode 140. FIG. 2B illustrates the small rise in current from t3-t4 over the SiC diode 140 (I sic2). In act 212, the method ends.

The method 200 may be repeated during inverter operations in a similar manner to provide a V− output voltage from the inverter. For instance, in act 204, the switching device 112 would be switched on (i.e., closed) supplying V− to the AC switch 102 through the output 106. In acts 204-210, for a negative output voltage the compliment of each switch would be utilized to switch and pass a majority of the current through switching device 136 and the switching devices 124 and 118.

In at least some embodiments, switching performance, capacity, and efficiency are optimized when the devices of the first and second segments are selectively coupled in parallel with the devices of the third and fourth segments. In addition, the inclusion of SiC diodes further limits switching loses and increases thermal efficiency of the switching systems of FIGS. 1, 3A, 3B, and 5.

Figure 3A:
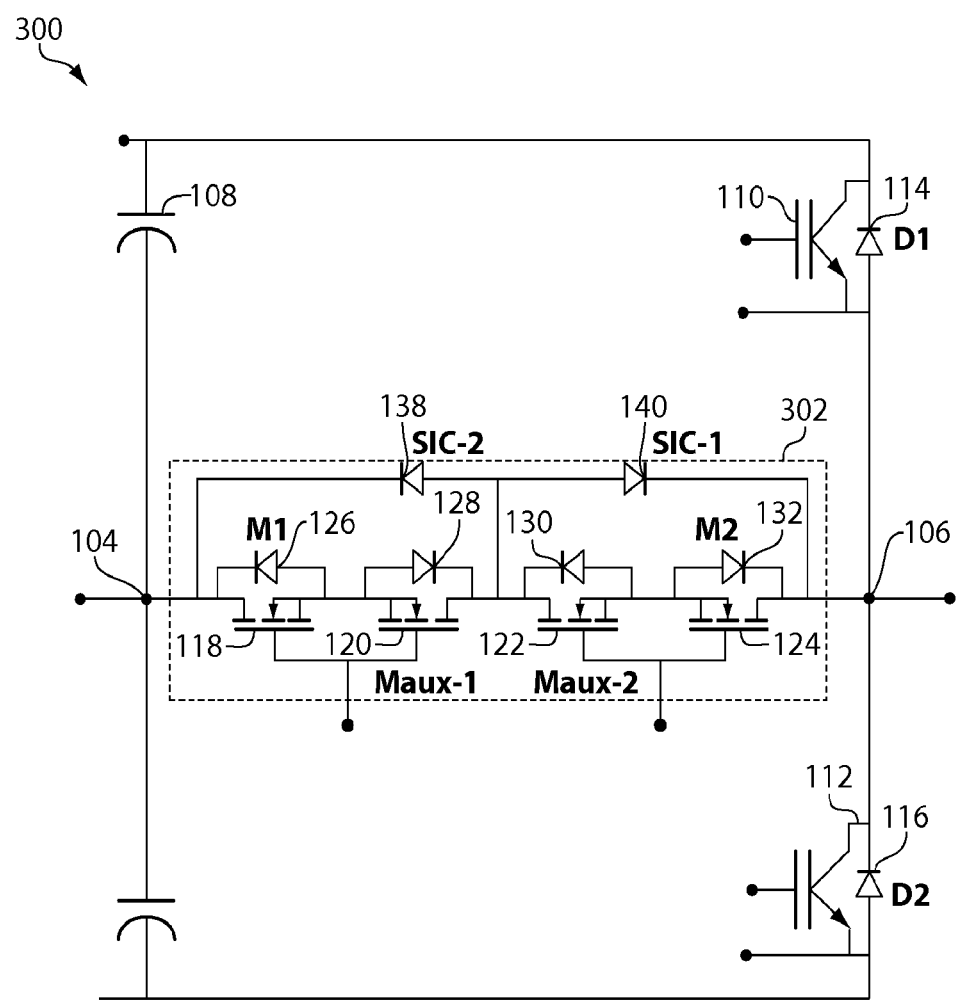
FIG. 3A is another schematic diagram of an inverter with an AC switch according to one embodiment.

Referring to FIG. 3A, an inverter according to one embodiment is illustrated generally at 300. The inverter 300 may be configured similar to the inverter 100 of FIG. 1 and may function in a manner similar to the method of FIG. 2 discussed above. The inverter 300 includes an AC switch 302, a neutral point 104, an output 106, switching devices 110 and 112, anti-parallel diodes 114 and 116, switching device 118-124, body diodes 126-132, and SiC diodes 138 and 140. The inverter 300 differs from the inverter 100 of FIG. 1 in that the switching devices 134 and 136 of FIG. 1 are absent from the AC switch 302 of inverter 300. In at least one embodiment, the absence of the switching devices 134 and 136 enhances the switching frequency of the inverter 300 but at a cost of reduced current capacity.

Figure 3B:
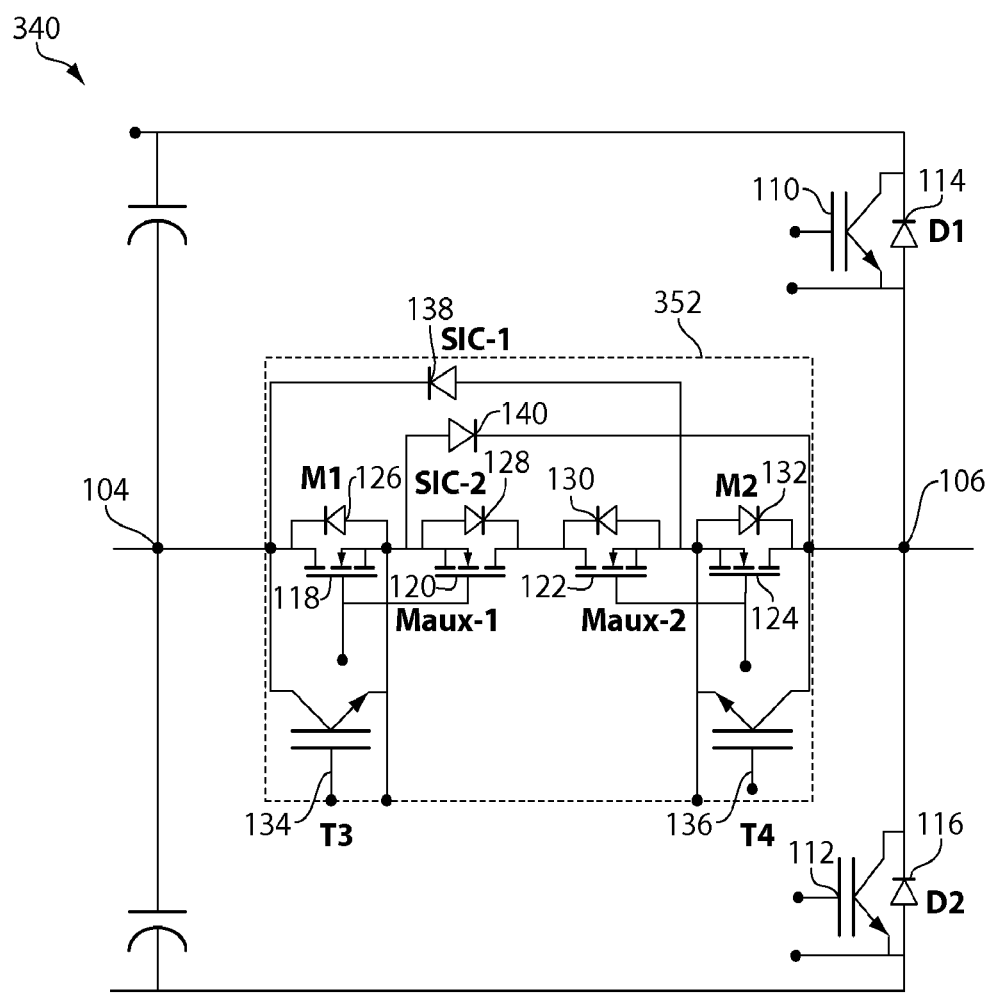
FIG. 3B is another schematic diagram of an inverter with an AC switch according to one embodiment.

Referring to FIG. 3B, an inverter is generally illustrated generally at 340. The inverter 340 may be configured similar to the inverter 100 of FIG. 1 and may function in a manner similar to the method of FIG. 2 discussed above. The inverter 340 includes an AC switch 352, a neutral point 104, an output 106, switching devices 110 and 112, anti-parallel diodes 114 and 116, switching device 118-124, body diodes 126-132, and diodes 138 and 140. In contrast with the inverter 100 of FIG. 1, the switching devices 134 and 136 are configured with a cathode of the diodes 138 and 140 coupled to a collector of the switching devices 134 and 136, respectively. Likewise, the switching devices 134 and 136 are configured with an anode of the diodes 138 and 140 coupled to an emitter of the switching devices 134 and 136, respectively. Also, the cathode of the diode 138 is coupled to the first I/O with an anode of the diode 138 coupled to a junction between a source of the switching device 122 and a source of the switching device 124. In addition, the diode 140 is configured with a cathode coupled to the output 106 and an anode coupled to the junction of a source of the switching device 118 and a source of the switching device 120. One advantage of the AC switch 352 is a shared emitter between switching devices 118, 134, and 120. Likewise, the switching devices 124, 136 and 122 share an emitter. The sharing of an emitter between the switching devices enables the AC switch 352 to advantageously utilize only two auxiliary power supplies to operate the AC switch 352.

Figure 4A:
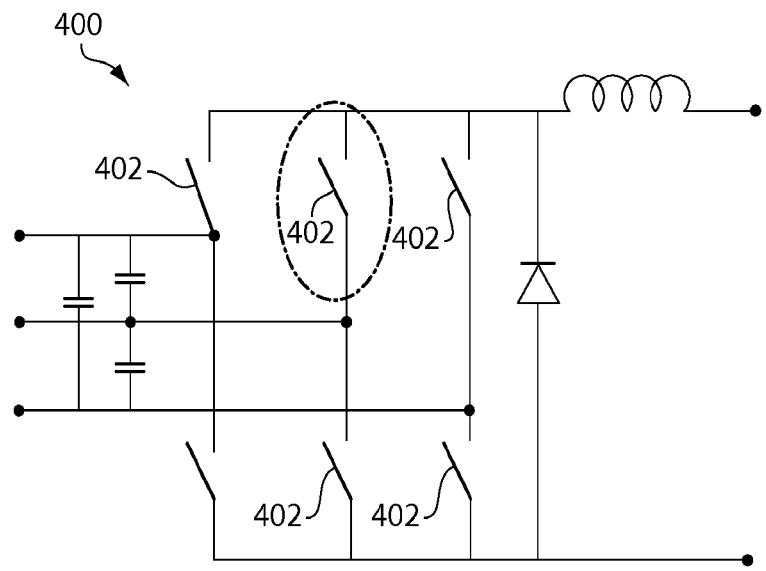
FIG. 4A is a schematic diagram of an AC switch within an AC/DC buck bi-directional converter according to some embodiments.

FIG. 4A illustrates an AC/DC buck bi-directional converter generally designated at 400. The AC/DC buck bi-directional converter 400 includes switching circuits 402. In various embodiments, the switching circuits 402 may be comprised of any one of the AC switches 102, 302, and 350 illustrated in FIGS. 1, 3A, and 3B. For instance, within the AC/DC buck bi-directional converter 400, the switching circuit 402 may be configured as the AC switch 102 (FIG. 1). The inclusion of such an arrangement may enhance the quality of output waveform, provide power factor correction (PFC), and an adjustable step-down DC voltage. In still other embodiments, the switching circuits 402 may be comprised of a mix of traditional switching circuits and the AC switches 102, 302 and 350 of FIGS. 1, 3A and 3B.

Figure 4B:
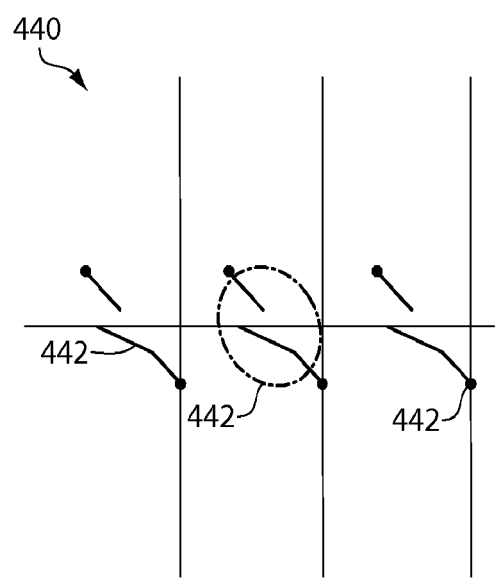
FIG. 4B is a schematic diagram of an AC switch within a matrix converter according to some embodiments.

FIG. 4B illustrates a matrix converter generally designated at 440. The matrix converter 440 includes switching circuits 442. In various embodiments, the switching circuits 442 may be comprised of any one of the AC switches 102, 302, and 350 illustrated in FIGS. 1, 3A, and 3B. For instance, within the matrix converter 440 the switching circuits 442 may be configured as the AC switch 102 (FIG. 1). In still other embodiments, the switching circuits 442 may be comprised of a mix of traditional switching circuits and the AC switches 102, 302 and 350 of FIGS. 1, 3A and 3B.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An AC switching system comprising:
   a first I/O;
   a second I/O;
   a first segment including a first plurality of switches, the first segment having a first end and a second end with the first end being coupled to the first I/O;
   a second segment including a second plurality of switches, the second segment having a first end and a second end with the first end of the second segment being coupled to the second end of the first segment and the second end of the second segment being coupled to the second I/O;
   a third segment including a diode, the diode of the third segment being coupled to the first I/O and directly coupled to the second end of the first segment and the first end of the second segment; and
   a fourth segment including a diode, the fourth segment being coupled to the second I/O and coupled to the second end of the first segment and the first end of the second segment.

2. The AC switching system of claim 1, wherein each of the first plurality of switches and the second plurality of switches include at least one metal-oxide semiconductor field-effect transistor (MOSFET).

3. The AC switching system of claim 2, wherein the at least one MOSFET is a low-voltage MOSFET.

4. The AC switching system of claim 2, wherein the at least one MOSFET is a high-voltage MOSFET.

5. The AC switching system of claim 1, wherein each of the third segment and the fourth segment further include at least one switching device.

6. The AC switching system of claim 5, wherein the at least one switching device is an insulated bi-polar transistor (IGBT).

7. The AC switching system of claim 1, wherein each of the first diode and the second diode is a silicon-carbide (SiC) diode.

8. The AC switching system of claim 1, further comprising:
   a first switching device, wherein the first switching device is configured to couple a positive voltage to the second I/O during a first mode of operation; and
   a second switching device, wherein the second switching device is configured to couple a negative voltage to the second I/O during a second mode of operation.

9. The AC switching system of claim 8, wherein each of the first switching device and the second switching device is a silicon-carbide junction gate field-effect transistor (SiC-JFET).

10. The AC switching system of claim 8, wherein each the first switching device and the second switching device is an IGBT device.

11. The AC switching system of claim 1, wherein the AC switching system is configured to function as an AC/DC buck bi-directional converter.

12. The AC switching system of claim 1, wherein the AC switching system is configured to function as a matrix converter.

13. The AC switching system of claim 1, wherein a cathode of the diode of the third segment is directly coupled to the first I/O and an anode of the diode of the third segment is directly coupled to both the second end of the first segment and the first end of the second segment.

14. A method of operating an AC switching system having a first I/O, a second I/O, a first segment including a first plurality of switches, a second segment including a second plurality of switches, a third segment including a diode, and a fourth segment including a diode, the method comprising:
closing a first switching device of the system in the first segment, wherein the first switching device provides a path for a first current through a first diode and a second diode to the second I/O during a first period of time;
closing a second switching device of the system in the third segment during a second period of time, the second period of time being greater than the first period of time, wherein the second switching device couples the first I/O to a junction of the first diode and the second diode to provide a second current from the first I/O to the second I/O; and
closing a third switching device of the system in the second segment during a third period of time, wherein the third switching device is coupled to the first diode and provides a path for the second current through a third diode, wherein the third diode is coupled to the second I/O, and wherein a majority of the second current during the second period of time and the third period of time is conducted through the second switching device, and only a portion of the first current is conducted by the third diode during the third period of time.

15. The method of claim 14, further comprising closing a fourth switching device of the system in the second segment, the fourth switching device providing a path for a third current through a fourth diode and a fifth diode to the first I/O during a fourth period of time.

16. The method of claim 15, further comprising:
closing a fifth switching device of the system in the fourth segment during a fifth period of time, the fifth period of time being greater than the fourth period of time, the fifth switching device coupling the second I/O to a junction of the fourth diode and the fifth diode to provide a fourth current from the second I/O to the first I/O; and
closing a sixth switching device of the system in the first segment during a sixth period of time, the sixth switching device being coupled to the fourth diode and providing a path for the fourth current through a sixth diode.

17. The method of claim 16, wherein closing the sixth switching device during a sixth period of time further includes coupling the sixth diode to the first I/O, and wherein a majority of the fourth current during the fifth period of time and the sixth period of time is conducted through the fifth switching device, and only a portion of the fourth current is conducted by the sixth diode during the sixth period of time.

18. The method of claim 14, further comprising:
opening a seventh switching device of the system prior to the first period of time, the seventh switching device being coupled to a positive DC voltage; and
opening an eighth switching device of the system prior to the fourth period of time, the eighth switching device being coupled to a negative DC voltage.

19. An AC switching system comprising:
a first I/O;
a second I/O;
a first segment including a first plurality of switches, the first segment having a first end and a second end with the first end being coupled to the first I/O;
a second segment including a first switch and a second switch, the second segment having a first end and a second end with the first end of the second segment being coupled to the second end of the first segment and the second end of the second segment being coupled to the second I/O;
a third segment including a diode, the third segment being coupled to the first I/O and coupled to a second end of the first switch and a first end of the second switch; and
a fourth segment including a diode, the fourth segment being coupled to the second I/O and coupled to a junction of two switches of the first plurality of switches.

20. The AC switching system of claim 19, the AC switching system further comprising:
a first switching device, wherein the first switching device is configured to couple a positive voltage to the second I/O during a first mode of operation;
a second switching device, wherein the second switching device is configured to couple a negative voltage to the second I/O during a second mode of operation.

21. The AC switching system of claim 20, wherein each of the positive voltage and the negative voltage is under 200 volts.

* * * * *